United States Patent
Lenchenkov (10) Patent No.: US 9,786,702 B2
(45) Date of Patent: Oct. 10, 2017

(54) BACKSIDE ILLUMINATED IMAGE SENSORS HAVING BURIED LIGHT SHIELDS WITH ABSORPTIVE ANTIREFLECTIVE COATING

(71) Applicant: Semiconductor Components Industries, LLC, Phoenix, AZ (US)

(72) Inventor: Victor Lenchenkov, Sunnyvale, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 348 days.

(21) Appl. No.: 14/011,560

(22) Filed: Aug. 27, 2013

(65) Prior Publication Data
US 2014/0077061 A1    Mar. 20, 2014

Related U.S. Application Data

(60) Provisional application No. 61/703,697, filed on Sep. 20, 2012.

(51) Int. Cl.
*H01L 27/146* (2006.01)
*H01L 27/144* (2006.01)

(52) U.S. Cl.
CPC .... *H01L 27/1446* (2013.01); *H01L 27/14623* (2013.01); *H01L 27/14627* (2013.01)

(58) Field of Classification Search
CPC ............... H01L 27/146; H01L 27/1464; H01L 27/14621; H01L 27/14623; H01L 27/14627
USPC ........ 250/208.1, 214.1, 226; 438/57, 70, 72, 438/74, 160, 175; 257/432, 435, 437, 257/447
See application file for complete search history.

(56) References Cited

U.S. PATENT DOCUMENTS

| | | | |
|---|---|---|---|
| 5,432,363 A | 7/1995 | Kamisaka et al. | |
| 7,453,131 B2 | 11/2008 | Marshall et al. | |
| 7,935,994 B2 | 5/2011 | Wang et al. | |
| 8,383,440 B2 | 2/2013 | Wang et al. | |
| 2004/0079865 A1* | 4/2004 | Hoshi ....................... | G01J 1/04 250/214.1 |

(Continued)

OTHER PUBLICATIONS

Agranov et al., U.S. Appl. No. 13/860,157, filed Apr. 10, 2013.
Lenchenkov et al., U.S. Appl. No. 13/964,462, filed Aug. 12, 2013.

*Primary Examiner* — Georgia Y Epps
*Assistant Examiner* — Don Williams
(74) *Attorney, Agent, or Firm* — Treyz Law Group, P.C.; Jason Tsai; Joseph F. Guihan (57) ABSTRACT

An image sensor with an array of image sensor pixels is provided. Each image pixel may include a photodiode and associated pixel circuits formed in the front surface of a semiconductor substrate. Buried light shielding structures may be formed on the back surface of the substrate to prevent pixel circuitry that is formed in the substrate between two adjacent photodiodes from being exposed to incoming light. The buried light shielding structures may be lined with absorptive antireflective coating material to prevent light from being reflected off the surface of the buried light shielding structures. Forming buried light shielding structures with absorptive antireflective coating material can help reduce optical pixel crosstalk and enhance signal to noise ratio.

16 Claims, 4 Drawing Sheets

(56) References Cited

U.S. PATENT DOCUMENTS

| | | | |
|---|---|---|---|
| 2010/0230729 A1* | 9/2010 | Ellis-Monaghan | H01L 27/14609 257/228 |
| 2011/0031573 A1* | 2/2011 | Nagase | 257/432 |
| 2011/0241152 A1* | 10/2011 | Hsiao | H01L 27/14689 257/447 |
| 2012/0104534 A1* | 5/2012 | Lee | H01L 27/1463 257/447 |
| 2012/0147208 A1* | 6/2012 | Otsuka et al. | 257/432 |
| 2012/0286137 A1* | 11/2012 | Yamaguchi | H01L 27/14607 250/208.1 |
| 2013/0299886 A1* | 11/2013 | Chuang | H01L 27/14623 257/292 |

\* cited by examiner

BACKSIDE ILLUMINATED IMAGE SENSORS HAVING BURIED LIGHT SHIELDS WITH ABSORPTIVE ANTIREFLECTIVE COATING

This application claims the benefit of provisional patent application No. 61/703,697, filed Sep. 20, 2012, which is hereby incorporated by reference herein in its entirety.

BACKGROUND

This relates generally to image sensors, and more specifically, to backside illuminated image sensors.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. A dielectric stack is formed on the front surface of the substrate directly on top of the photodiodes. The dielectric stack includes metal routing lines and metal vias formed in dielectric material. Light guides are often formed in the dielectric stack to guide the trajectory of incoming light.

A color filter array is formed over the dielectric stack to provide each pixel with sensitivity to a certain range of wavelengths. Microlenses may be formed over the color filter array. Light enters from a front side of the image sensor (i.e., light enters the microlenses and travels through the color filters into the dielectric stack). An image sensor used in this way is referred to as a front-side illumination (FSI) image sensor.

It is desired to use the light guides to direct the incoming light into the photodiodes. The incoming light, however, is sometimes reflected and absorbed by the metal routing lines and vias when traversing the dielectric stack. This results in undesirable pixel crosstalk and signal degradation.

To address these issues, backside illumination image sensors have been developed. These sensors are, however, also subject to crosstalk as stray light that is intended for a given photodiode can still leak into an adjacent photodiode, thereby degrading quantum efficiency and signal to noise ratio.

It would therefore be desirable to be able to provide image sensors with improved performance.

DETAILED DESCRIPTION

Embodiments of the present invention relate to image sensors, and more particularly, to backside illuminated (BSI) image sensors with buried light shield structures. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands of pixels or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
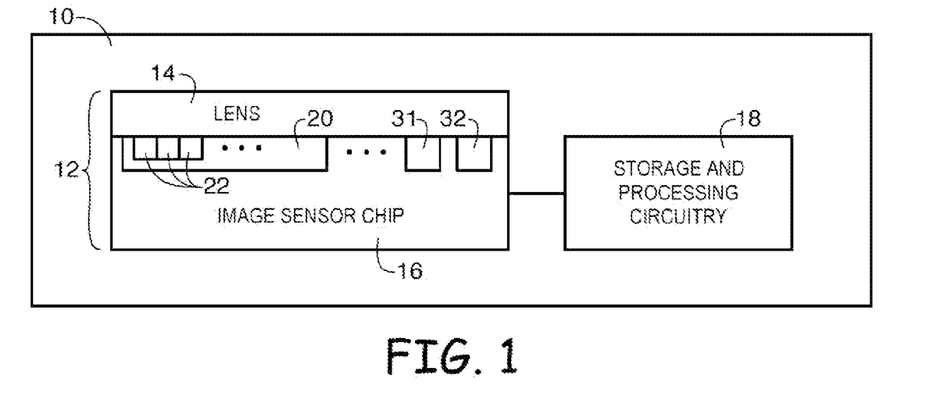
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20 or on a separate companion die/chip.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 16. Image sensor 16 may, for example, be a backside illumination image sensor. If desired, camera module 12 may be provided with an array of lenses 14 and an array of corresponding image sensors 16.

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

Figure 2:
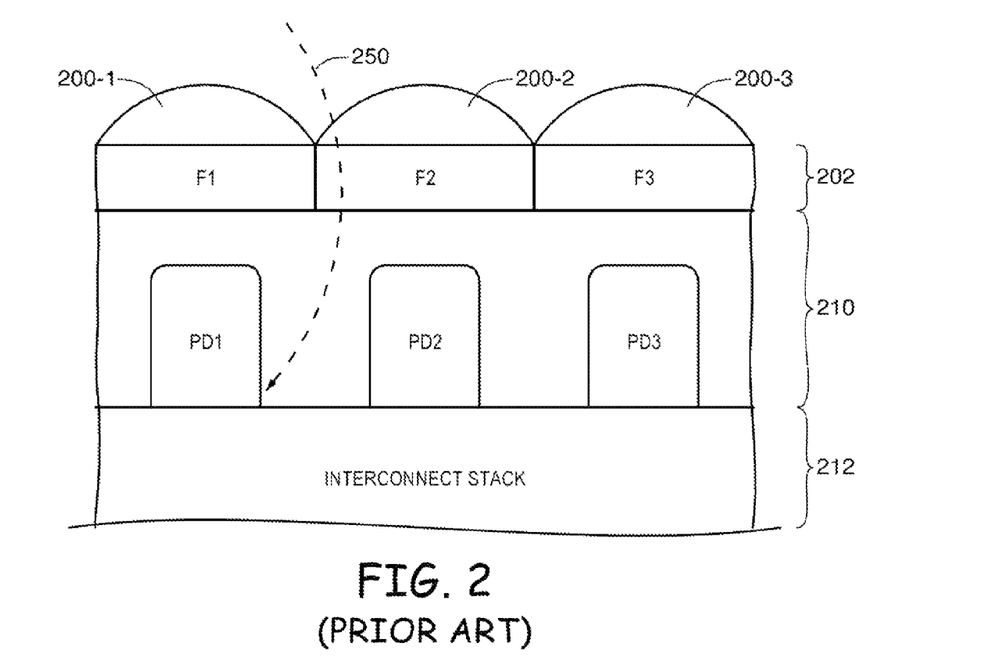
FIG. 2 is a cross-sectional side view of a conventional backside illuminated image sensor.

FIG. 2 shows a cross-sectional side view of a conventional backside illuminated (BSI) image sensor. As shown in FIG. 2, photodiode PD1 associated with a first image sensor pixel, photodiode PD2 associated with a second image sensor pixel, and photodiode PD3 associated with a third image sensor pixel can be formed in a first (front) surface of p-type substrate 210.

A dielectric stack 212 is formed on the front surface of substrate 210. Dielectric stack 212 is formed from dielectric material such as silicon oxide. Interconnect routing structures is formed in dielectric stack 212. Dielectric stack 212 is therefore sometimes be referred to as an interconnect stack.

A color filter array 202 is formed on a second (back) surface of substrate 210. In particular, a first color filter element F1 may be formed on the back surface of substrate 210 above PD1; a second color filter element F2 may be formed on the back surface of substrate 210 above PD2; and a third color filter element F3 may be formed on the back surface of substrate 210 above PD3. Filter element F1 may serve to pass green light; filter element F2 may serve to pass red light; and filter element F3 may serve to pass green light.

A microlens array is typically formed on top of color filter array 202. The microlens array includes a first microlens 200-1 formed on top of first color filter element F1, a second microlens 200-2 formed on top of second color filter element F2, and a third microlens 200-3 formed on top of third color filter element F3. Microlens 200-1 serves to focus light towards PD1. Microlens 200-2 serves to focus light towards PD2. Microlens 200-3 serves to focus light towards PD3.

Incoming light may enter substrate 210 from the back surface. Image sensor pixels operated in this way are therefore referred to as backside illuminated (BSI) image sensor pixels. In some scenarios, however, light that is intended for one image pixel may inadvertently leak into an adjacent pixel. In the example of FIG. 2, light that is intended for photodiode PD2 may leak undesirably into photodiode PD1 and result in optical pixel crosstalk.

Figure 3:
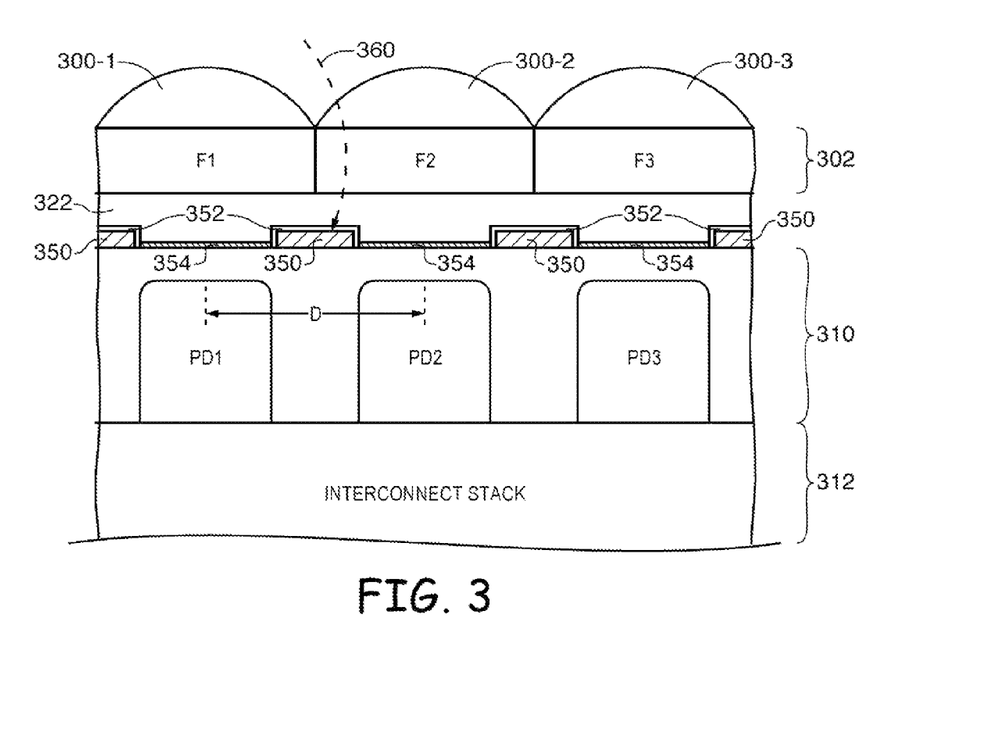
FIG. 3 is a cross-sectional side view of an illustrative backside illuminated image sensor that includes buried light shielding structures covered with absorptive antireflective coating (ARC) material in accordance with an embodiment of the present invention.

In accordance with an embodiment of the present invention, a BSI image sensor 16 may be provided with light shielding structures configured to prevent stray light from propagating into unintended photodiodes (see, e.g., FIG. 3). As shown in FIG. 3, photosensitive elements such as photodiode PD1 associated with a first image sensor pixel 22, photodiode PD2 associated with a second image sensor pixel 22, and photodiode PD3 associated with a third image sensor pixel 22 may be formed in a first (front) surface of semiconductor substrate 310 (e.g., a p-type silicon substrate). Other pixel structures such as floating diffusion regions and associated pixel control transistors may also be formed in the front surface of substrate 310 in regions between adjacent/neighboring photodiodes.

A dielectric stack such as dielectric stack 312 may be formed on the front surface of substrate 310. Dielectric stack 312 may be formed from dielectric material such as silicon oxide. Interconnect routing structures such as conductive signal routing paths and conductive vias may be formed in dielectric stack 312 to contact the various pixel transistor terminals. Dielectric stack 312 may therefore sometimes be referred to as an interconnect stack.

A color filter array such as color filter array structure 302 may be formed over a second (back) surface of substrate 310. In the example of FIG. 3, a first color filter element F1 may be formed over the back surface of substrate 310 above PD1; a second color filter element F2 may be formed over the back surface of substrate 310 above PD2; and a third color filter element F3 may be formed over the back surface of substrate 310 above PD3. Filter element F1 may serve to pass light in a first portion of the visible spectrum; filter element F2 may serve to pass light in a second portion of the visible spectrum that is different than the first portion; and filter element F3 may serve to pass light in a third portion of the visible spectrum that is different than the second portion. In general, color filter elements F1, F2, and F3 may each be configured to pass through a selected one of: green light, red light, blue light, cyan light, magenta light, yellow light, and/or other types of light.

A microlens array may be formed on top of color filter array 302. The microlens array may include a first microlens 300-1 formed on top of first color filter element F1, a second microlens 300-2 formed on top of second color filter element F2, and a third microlens 300-3 formed on top of third color filter element F3. Microlens 300-1 may be used to focus light towards PD1. Microlens 300-2 may be used to focus light towards PD2. Microlens 300-3 may be used to focus light towards PD3.

In one suitable arrangement, light shielding structures such as structures 350 may be formed on the back surface of substrate 310 in regions located between each pair of adjacent photodiodes. Light shielding structures 350 may be formed from tungsten, copper, gold, silver, aluminum, or other suitable conductive/reflective material. Shielding structures 350 that are formed using tungsten may sometimes be referred to as tungsten buried light shields (WBLS). If desired, light shielding structures 350 may be formed as ring-shaped structures that line the perimeter of each color filter element (e.g., each light shield structure may be least partially interposed between two adjacent photodiodes). For example, the ring-shaped light shield structures may have openings aligned to corresponding photodiodes formed in the substrate. Light shield structures formed in this way may serve to block stray light from inadvertently propagating in unwanted directions (as indicated by light path 360).

Shielding structures 350 may be opaque to light but may be reflective. To prevent potential reflections and undesired scattering of light which can result in unwanted optical pixel crosstalk, a layer of antireflective coating (ARC) material 352 can be formed over buried light shields 350 via sputtering, other types of physical vapor deposition, or other types of deposition techniques (e.g., chemical vapor deposition, electrochemical deposition, ink-jet patterning, pad printing, spinning, spraying, etc.). Oxide material 322 is formed over the back surface of substrate 310 to provide a planar surface on which color filter array 302 can then be formed.

As an example, buried light shield structures 350 may be lined with a layer of silicon nitride (SiN). Silicon nitride liner 352 may have an index of refraction having a real component n that is approximately equal to 2.1 and an imaginary component k that is equal to 0.3. Coating structures 350 with such type of ARC material can help absorb any stray light in the 400-700 nm wavelength range and prevent light in that range from reflecting off the surface of structures 350. Liner 352 formed in this way can therefore sometimes be referred to as an "absorptive" antireflective layer.

The example of using silicon nitride in ARC liner 352 is merely illustrative and does not serve to limit the scope of the present invention. Consider a scenario in which oxide material 322 is formed from a material with refractive index n1 and in which buried light shielding structure 382 is formed from a material with refractive index n2. In general, ARC liner 352 may be any material having a refractive index that is between n1 and n2. As an example, liner 352 may exhibit a refractive index that is equal to the geometric mean of n1 and n2. As another example, liner 352 may exhibit an index of refraction that is greater than n1 and less than n2. In general, the refractive index values vary as a function of wavelength. The choice of ARC material may therefore depend on the particular wavelength of light that should be attenuated.

In some arrangements, additional antireflective material such as ARC liner 354 may be formed over the photodiodes (see, FIG. 3). Liner 354 formed at the interface between dielectric material 322 (formed from silicon oxide) and substrate 310 (formed from crystalline silicon) may generally be formed from different materials as that of ARC liner 352 (i.e., liners 350 and 352 may have different indices of refraction). If desired, liners 350 and 352 may be formed from the same material. In general, forming absorptive liners over the photodiodes and on top of the buried light shielding structures may help prevent light from being reflected off the back surface of substrate 310 at undesired angles, thereby drastically reducing optical pixel crosstalk while improving quantum efficiency and pixel signal to noise ratio.

Figure 4:
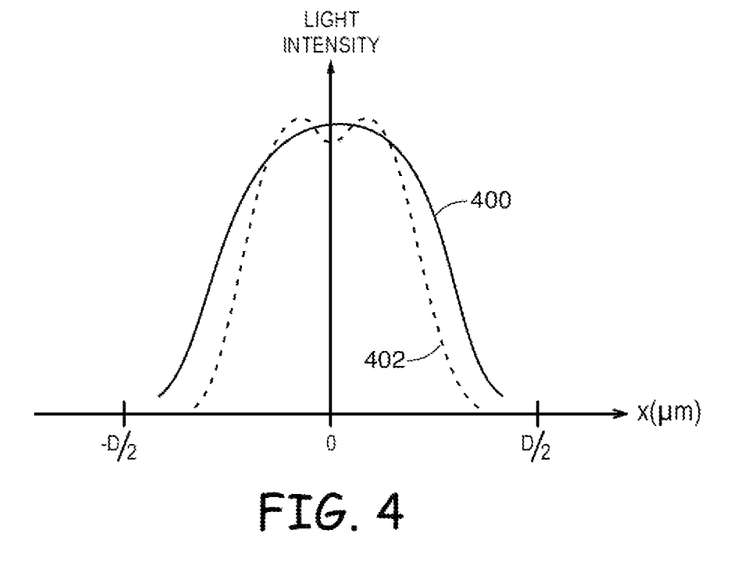
FIG. 4 is a diagram illustrating how the buried light shielding structures of FIG. 3 can be used to reduce optical crosstalk in accordance with an embodiment of the present invention.

FIG. 4 is a diagram plotting the intensity of light as detected using a photodiode taken along the width of the photodiode. The distance from the center of one photodiode to a neighboring photodiode may be defined as length D (see, FIG. 3). Referring back to FIG. 4, curve 400 may represent the light intensity profile sensed by a photodiode in a conventional image sensor pixel that does not include any buried light shielding structures, whereas curve 402 may represent the light intensity profile sensed by a photodiode in an illustrative image sensor pixel of the type described in connection with FIG. 3 (e.g., in a image sensor pixel that includes buried light shielding structures 350 covered with ARC liner 352).

In general, incoming light entering a photodiode may be better absorbed if the light intensity profile is more narrow (i.e., the light is focused at greater intensity levels near the center of the photodiode). Narrower light diffraction profiles also result in reduced optical pixel crosstalk. As shown in FIG. 4, it may therefore be desirable to form buried light shielding structures that are covered with ARC material to provide image sensor pixels with enhanced efficiency and reduced cross-talk.

Figure 5:
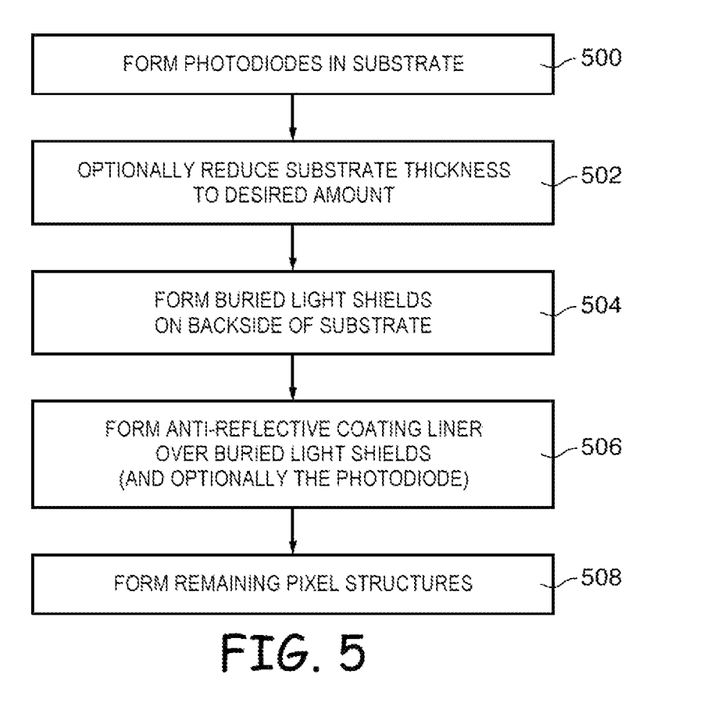
FIG. 5 is a flow chart of illustrative steps for forming an image sensor of the type shown in FIG. 3 in accordance with an embodiment of the present invention.

FIG. 5 is a flow chart of illustrative steps involved in forming the pixel structure of FIG. 3. At step 500, photodiodes and other pixel circuitry may be formed in the front surface a semiconductor substrate. At step 502, the thickness of the substrate may be optionally reduced by a predetermined amount using chemical-mechanical planarization (CMP) operations or other suitable polishing mechanisms at the back surface of the substrate. At step 504, buried light shield structures may be formed on the back surface of the substrate in regions that do not overlap with the photodiodes. Buried light shield structures formed in this way may prevent regions in the substrate between adjacent photodiodes from being inadvertently exposed to stray light.

At step 506, antireflective coating material may be selectively deposited on the buried light shield structures. For example, a layer of silicon nitride may be formed to cover the upper surface of the buried light shields. In general, sputtering, other types of physical vapor deposition, or other types of deposition techniques (e.g., chemical vapor deposition, electrochemical deposition, ink-jet patterning, pad printing, spinning, spraying, etc.) may be used in depositing the ARC material over the buried light shields. As described in connection with FIG. 3, different ARC material may be optionally formed over the photodiodes in a separate deposition operation.

At step 508, a dielectric stack including any interconnect routing structures may be formed on the front surface of the semiconductor substrate. Other pixel structures such as a color filter array and a microlens array may subsequently be formed over the dielectric stack. Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The embodiment described thus far relates to backside illuminated image sensors. In general, the embodiments of the present invention can also be applied to front-side illuminated (FSI) image sensors, image sensors operating in global shutter mode, image sensors operating in rolling shutter mode, and other types of imaging sensors to help reduce optical pixel cross-talk.

Figure 6:
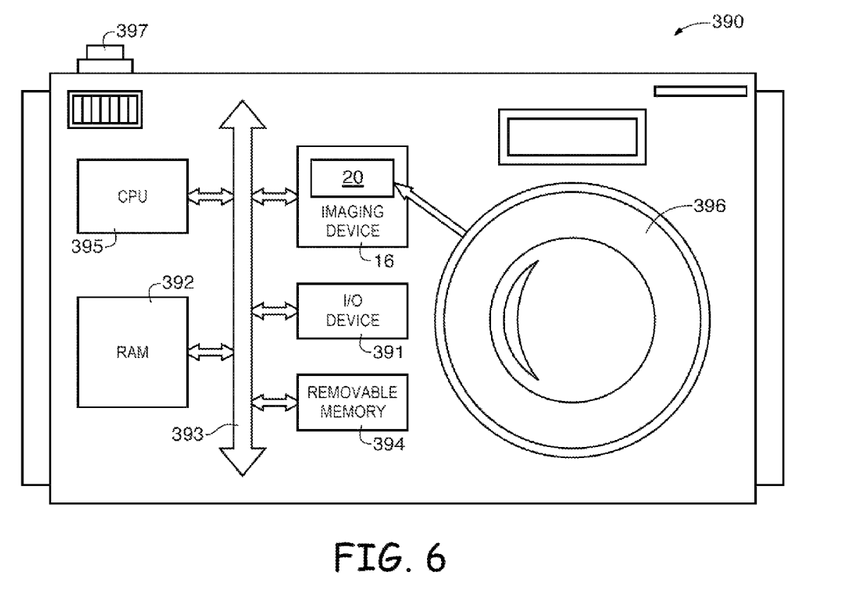
FIG. 6 is a block diagram of a processor system that may employ some of the embodiments of FIG. 3 in accordance with an embodiment of the present invention.

FIG. 6 shows, in simplified form, a typical processor system 390. Processor system 390 is exemplary of a system having digital circuits that include imaging device 16 with the buried light shield structures of FIG. 3. Without being limiting, such a system could include a computer system, still or video camera system, scanner, machine vision, vehicle navigation, video phone, surveillance system, auto focus system, star tracker system, motion detection system, image stabilization system, video gaming system, video overlay system, and other systems employing an imaging device.

Processor system 390, which may be a digital still or video camera system, may include a lens such as lens 396 for focusing an image onto a pixel array such as pixel array 20 when shutter release button 397 is pressed. Processor system 390 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 16 may also communicate with CPU 395 over bus 393. System 390 may include random access memory (RAM) 392 and removable memory 394. Removable memory 394 may include flash memory that communicates with CPU 395 over bus 393. Imaging device 16 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems with buried light shield structures. A system may include an image sensor module with an array of image sensor pixels and one or more lenses that focus light onto the array of image sensor pixels (e.g., image pixels arranged in rows and columns).

In particular, hundreds or thousands of photodiodes may be formed in the front surface of a semiconductor substrate. An interconnect stack may be formed on the front substrate. Buried light shield structures such as light shielding structures made from tungsten may be formed on the back surface of the substrate. The light shield structures may be ring-shaped light shielding structures (as an example) and may be at least partially interposed between each adjacent pair of photodiodes. Absorptive antireflective coating material (e.g., a layer of silicon nitride) may be deposited on the buried light shield structures.

The buried light shield structures may be used to prevent pixel circuits formed in the substrate between adjacent photodiodes from being exposed to incoming (stray) light. Dielectric material (e.g., silicon oxide) having a first refractive index may be formed over the light shield structures. The buried light shield structures may have a second refractive index. The absorptive antireflective coating material may have a third refractive index that is between the first and second refractive indices (e.g., the third refractive index may be greater than the first refractive index and may be less than the second refractive index). If desired, an antireflective coating liner having a refractive index that is different from the third refractive index may be selectively formed over the photodiodes.

The foregoing is merely illustrative of the principles of this invention and various modifications can be made by those skilled in the art without departing from the scope and spirit of the invention. The foregoing embodiments may be implemented individually or in any combination.

What is claimed is:

1. A system, comprising:
   a central processing unit;
   memory;
   a lens;
   input-output circuitry; and
   an imaging device, wherein the imaging device comprises:
      an image sensor comprising:
         a substrate having front and back surfaces;
         a plurality of photodiodes formed in the front surface of the substrate, wherein the substrate has portions that are interposed between each pair of adjacent photodiodes in the plurality of photodiodes;
         a dielectric stack adjacent to the front surface of the substrate, wherein interconnect routing structures are formed in the dielectric stack;
         a plurality of color filter elements formed over the back surface of the substrate
         buried light shield structures formed on the back surface of the substrate, wherein the buried light shield structures are formed above the portions of the substrate that are interposed between each pair of adjacent photodiodes in the plurality of photodiodes and wherein the buried light shield structures do not overlap the plurality of photodiodes;
         antireflective coating material selectively formed on and in direct contact with the buried light shield structures, wherein the antireflective coating material does not overlap the plurality of photodiodes; and
         an antireflective liner selectively formed on the back surface of the substrate over the plurality of photodiodes, wherein the antireflective liner does not overlap the buried light shield structures and wherein the antireflective liner and the antireflective coating material have different indices of refraction.

2. The system defined in claim 1, wherein the buried light shield structures are formed from tungsten, and wherein the antireflective coating material is formed from silicon nitride.

3. The system defined in claim 1, wherein the buried light shield structures comprises ring-shaped light shielding structures having openings aligned to the plurality of photodiodes.

4. The system defined in claim 1, wherein an oxide material is interposed between the plurality of color filter elements and the buried light shield structures, wherein the oxide material directly contacts the plurality of color filter elements, and wherein the oxide material directly contacts the antireflective liner and the antireflective coating material.

5. An image sensor comprising:
   a substrate having front and back surfaces;
   a plurality of photodiodes formed in the front surface of the substrate, wherein the substrate has portions that are interposed between each pair of adjacent photodiodes in the plurality of photodiodes;
   buried light shield structures formed on the back surface of the substrate, wherein the buried light shield structures are formed above the portions of the substrate that are interposed between each pair of adjacent photodiodes in the plurality of photodiodes; and
   antireflective coating material selectively formed on only the buried light shield structures, wherein the antireflective coating material is in direct contact with the buried light shield structures and is not formed over the plurality of photodiodes.

6. The image sensor defined in claim 5, wherein the buried light shield structures are in direct contact with the back surface of the substrate.

7. The image sensor defined in claim 5, wherein the buried light shield structures do not overlap the plurality of photodiodes.

8. The image sensor defined in claim 7, wherein the front surface of the substrate is adjacent to a dielectric stack and wherein interconnect routing structures are formed in the dielectric stack.

9. The image sensor defined in claim 8, wherein a surface of each photodiode of the plurality of photodiodes is in direct contact with the dielectric stack.

10. The image sensor defined in claim 5, further comprising floating diffusion regions formed in the portions of the substrate that are interposed between each pair of adjacent photodiodes in the plurality of photodiodes such that the buried light shield structures overlap the floating diffusion regions.

11. The image sensor defined in claim 5, further comprising a color filter array structure formed over the plurality of photodiodes.

12. The image sensor defined in claim 11, further comprising:
   dielectric material interposed between the buried light shield structures and the color filter array structure.

13. The image sensor defined in claim 12, wherein the dielectric material has a first refractive index, wherein the buried light shield structures have a second refractive index, and wherein the antireflective coating material has a third refractive of index that is between the first and second refractive indices.

14. The image sensor defined in claim 5, further comprising:

an antireflective liner selectively formed on the back surface of the substrate over the plurality of photodiodes, wherein the antireflective liner does not overlap the buried light shield structures and wherein the antireflective liner and the antireflective coating material are formed from different materials.

15. The image sensor defined in claim 5, wherein the buried light shield structures comprise at least one ring-shaped light shield structure.

16. An image sensor comprising:
  a substrate having front and back surfaces;
  a plurality of photodiodes formed in the front surface of the substrate, wherein the substrate has portions that are interposed between each pair of adjacent photodiodes in the plurality of photodiodes;
  buried light shield structures formed on the back surface of the substrate, wherein the buried light shield structures are formed above the portions of the substrate that are interposed between each pair of adjacent photodiodes in the plurality of photodiodes; and
  antireflective coating material selectively formed on only the buried light shield structures, wherein the antireflective coating material is in direct contact with the buried light shield structures and is not formed over the plurality of photodiodes, wherein no portion of the antireflective coating material overlaps any of the plurality of photodiodes.

* * * * *